United States Patent

Kocsis et al.

[15] 3,675,092

[45] July 4, 1972

[54] SURFACE CONTROLLED AVALANCHE SEMICONDUCTOR DEVICE

[72] Inventors: Joseph Kocsis, Sunnyvale; Thomas Peter Cauge, Mountain View, both of Calif.

[73] Assignee: Signetics Corporation, Sunnyvale, Calif.

[22] Filed: July 13, 1970

[21] Appl. No.: 54,097

[52] U.S. Cl. ....................317/235 R, 317/235 T, 317/235 Z, 317/235 AL

[51] Int. Cl. ..........................................................H01l 11/02

[58] Field of Search................317/235, 21.1, 22.2, 30, 40.13

[56] References Cited

UNITED STATES PATENTS

| | | | |
|---|---|---|---|
| 3,271,640 | 9/1966 | Moore | 317/235 |
| 3,461,357 | 8/1969 | Mutter et al. | 317/234 |
| 3,434,019 | 3/1969 | Carley | 317/235 |

*Primary Examiner*—John W. Huckert
*Assistant Examiner*—E. Wojciechowicz
*Attorney*—Flehr, Hohbach, Test, Albritton & Herbert

[57] ABSTRACT

Surface controlled avalanche semiconductor device formed of a semiconductor body having a planar surface. The semiconductor body has an impurity therein so it has a conductivity of one type. Regions of opposite conductivity are formed in the body and provide P-N junctions which extend to the surface in such a manner that they form a pattern of a plurality of closed lines enclosing a plurality of small areas distributed over the surface with at least one portion of the surface being free of said P-N junctions and being in contact with said region of opposite conductivity type. A layer of insulating material overlies the surface. Source metallization is disposed on the layer of insulating material and extends through the layer of insulating material to make contact with said portion of the surface. Gate metallization separated from the source metallization overlies the layer of insulating material and the P-N junctions.

In the method for forming a surface controlled avalanche semiconductor device, there are formed in a semiconductor body of one conductivity type a plurality of regions of opposite conductivity type to form P-N junctions which extend to the surface so that a pattern is formed consisting of a plurality of closed lines which enclose small areas which are distributed over the surface of the semiconductor body with the exception of a small portion of the surface of the semiconductor body which is free of such P-N junctions and which is in contact with said region of opposite conductivity type. A layer of insulating material is formed on the surface. An opening is formed in the layer of insulating material overlying said portion of the surface area. Metallization is formed on the insulating layer in such a manner that source metallization extends through the opening in the insulating layer and makes contact with said region of opposite conductivity type and gate metallization is provided which overlies the insulating layer and said P-N junctions.

10 Claims, 19 Drawing Figures

INVENTORS
Joseph Kocsis
Thomas P. Cauge
BY Flehr, Hohbach, Test, Albritton & Herbert
Attorneys

PATENTED JUL 4 1972

3,675,092

SHEET 2 OF 2

INVENTORS
Joseph Kocsis
Thomas P. Cauge
BY Flehr, Hohbach, Test, Albritton & Herbert
Attorneys

SURFACE CONTROLLED AVALANCHE SEMICONDUCTOR DEVICE

BACKGROUND OF THE INVENTION

1. Field of the Invention

This invention relates to surface controlled avalanche semiconductor devices for microwave and UHF applications.

2. Description of the Prior Art

Surface controlled avalanche semiconductor devices have heretofore been provided. The principle of operation of such devices is well known to those skilled in the art. Typically, the P-N junction is reverse biased and then by superposition fields in the depletion region associated with the P-N junction via the gate electrode, it is possible to control the breakdown voltage of the device. In such devices it has been found that voltage gain is a function of the depth of the diffusion in the device and the resistivity of the lowly doped side of the junction. Since the voltage gain is high, any small change in gate voltage applied across the device will result in quite large changes in drain voltage. Since such devices rely on an MOS type of gate control, any slight changes in potential at the gate will cause large changes in operation of the device. Therefore, the device is basically unstable. Attempts have been made to overcome this deficiency by using very shallow diffused devices rather than deep diffused devices. It has been found that such a device has very low voltage gain with a high transconductance. Since the device has a small voltage gain, the device is inherently more stable than one using a deep diffusion. In view of these deficiencies of prior surface controlled avalanche semiconductor devices, there is a need for improved surface controlled valance semiconductor devices particularly for microwave and UHF applications.

SUMMARY OF THE INVENTION AND OBJECTS

The surface controlled avalanche semiconductor device consists of a semiconductor body which has a planar surface. The body has an impurity therein so that the body has a conductivity of one type. Regions of opposite conductivity type are formed in the body to provide P-N junctions which extend to the surface and form a pattern of a plurality of closed lines enclosing a plurality of small areas on the surface with the exception of one surface area which is free of said junctions and which overlies a portion of said region of opposite conductivity type. A layer of insulating material overlies the surface. An opening is formed in the layer of insulating material overlying said one portion of the surface. Source metallization extends through the opening and makes contact with said region of opposite conductivity type. Gate metallization overlies said layer of insulating material and said junctions.

In the method for forming a surface controlled avalanche semiconductor device, a semiconductor body is provided which has a planar surface. A diffusion mask is formed on the surface and has a pattern consisting of a plurality of closed lines enclosing a plurality of small areas with at least one portion of the surface being free of said pattern. An impurity of opposite conductivity type is diffused through the surface in the regions not covered by the diffusion mask so that there is formed dish-shaped P-N junctions which extend to the surface to define a plurality of closed lines which enclose a plurality of small areas. The diffusion mask is removed. An insulating layer of relatively precise thickness is formed on the surface. An opening is formed in the insulating layer to expose the portion of the surface. Metallization is formed on the insulating layer. A portion of this metallization serves as a source electrode and extends through the opening and the insulating layer to make contact with said region of opposite conductivity type. Another portion of the metallization serves as the gate electrode and overlies the insulating layer and said P-N junctions.

In general, it is an object of the present invention to provide a surface controlled avalanche semiconductor device and method which is suitable for microwave and UHF applications.

Another object of the invention is to provide a device and method of the above character which utilizes a self-aligned gate.

Another object of the invention is to provide a device and method of the above character which has much greater d.c. power handling capability per unit area.

Another object of the invention is to provide a device and method of the above character which is relatively simple.

Another object of the invention is to provide a device of the above character which has a high input impedance and, therefore, a very low lead-in inductance for high power and high frequency devices.

Another object of the invention is to provide a device of the above character which has a negative temperature coefficient so that the device will turn itself off as it heats up rather than on.

Another object of the invention is to provide a device and method of the above character in which only single diffusion is required which is non-critical.

Another object of the invention is to provide a device and method of the above character in which it is not necessary to align gates around individual active areas.

Another object of the invention is to provide a device of the above character in which it is possible to obtain higher power outputs at higher frequencies.

Additional objects and features of the invention will appear from the following description in which the preferred embodiments are set forth in detail in conjunction with the accompanying drawings.

DESCRIPTION OF THE PREFERRED EMBODIMENT

Figures 1, 2, 3, 4, 5, 6, 7, 8, 9, 10, 11, 12:
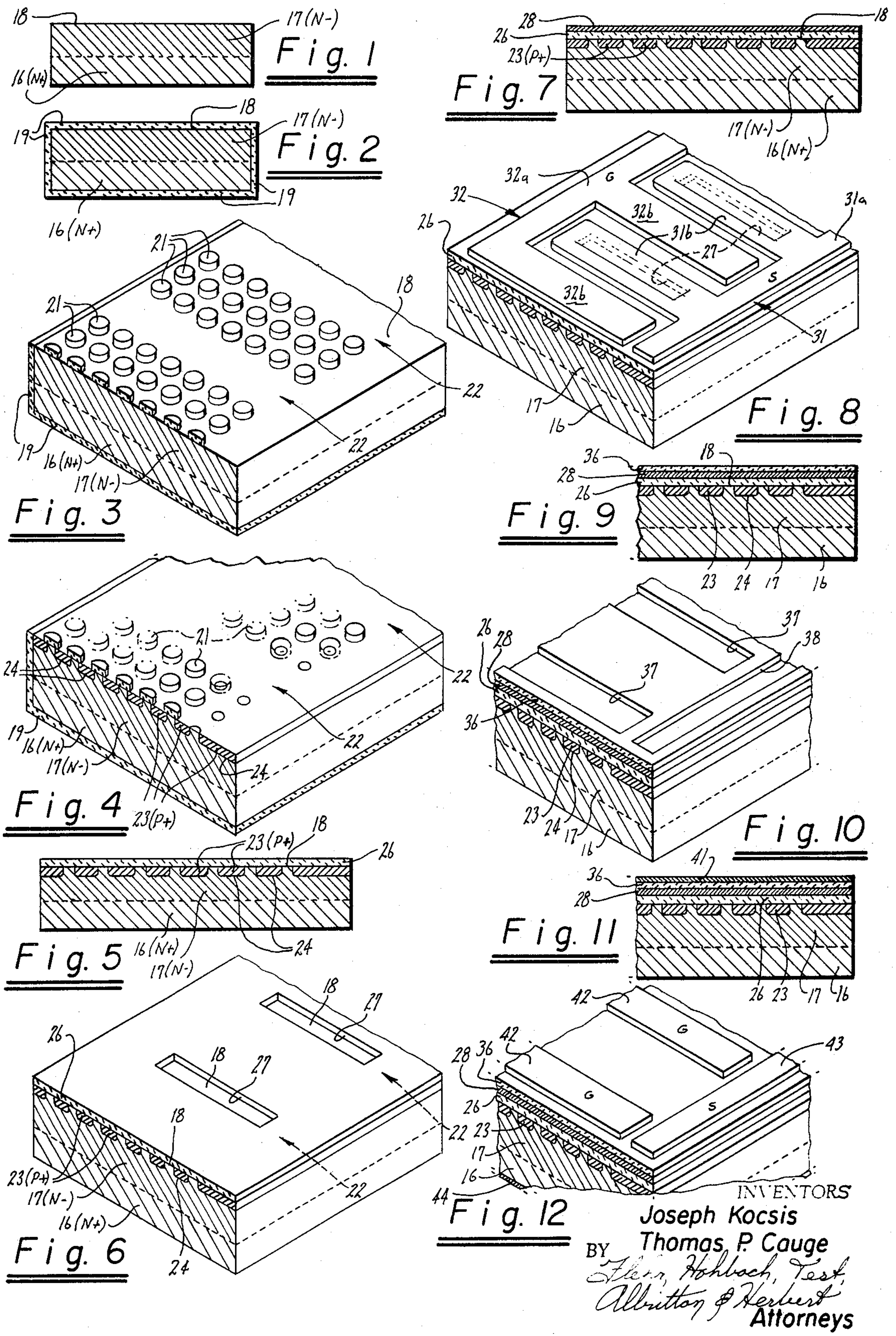
FIGS. 1–12 are views showing the steps utilized in performing the method for fabricating surface controlled avalanche semiconductor devices incorporating the present invention with certain of the views being greatly enlarged cross-sectional views and other of the views being combination isometric and cross-sectional views.

The fabrication of a surface controlled avalanche semiconductor device utilizing a method incorporating the present invention is shown in FIGS. 1–12. The method is commenced by taking a semiconductor body 16 formed of a suitable material such as silicon. As shown in FIG. 1, this silicon can be doped with a suitable impurity such as an N+ type impurity. An epitaxial layer 17 is formed thereon which has a relatively precise thickness and resistivity and which is also doped with an N- type impurity at a smaller concentration than in the semiconductor body 16. The thickness of the epitaxial layer 17 can vary from 1.5 to 6 microns and the resistivity can range from 0.4 to 6 ohm cm. If a completed semiconductor device is to be utilized for power applications, a fairly high breakdown voltage is desired, i.e. 100 volts or more and, therefore, the resistivity typically should be greater than 1 ohm cm. For small signal high frequency semiconductor devices, the resistivity can be lower, i.e. 0.4 ohm cm. and 1½ to 2 microns in thickness. In general, the resistivity and thickness ranges given cover very high frequency devices and medium frequency or UHF frequency high power semiconductor devices.

The epitaxial layer 17 is provided with a planar upper surface 18. An insulating layer 19 is formed on this upper surface 18 which is to be utilized as a diffusion mask. Typically, this layer 19 can be formed of silicon dioxide which is thermally grown or deposited in a conventional manner. A photoresist is then deposited on the layer 19 and this photoresist is exposed through a mask which provides a predetermined pattern in the photoresist. The photoresist is then developed in a conventional manner so that certain areas of the silicon dioxide layer 19 are protected. The unprotected areas are then etched away by suitable etch so that there remains a very large number of posts, pillars or pedestals 21 which are generally cylindrical in shape or, in other words, circular in cross-section which upstand vertically from the surface 18. The posts 21 are arranged in rows extending laterally and longitudinally of the surface 18 carried by the semiconductor body 16. As can be seen, the rows are relatively closely spaced in groups and larger spaces 22 extending transversely of the groups are provided for a purpose hereinafter described.

After the posts 21 have been formed, the structure shown in FIG. 3 is placed in a diffusion furnace and a P-type impurity such as boron is diffused downwardly into the surface 18 wherever the surface 18 is exposed and not covered by the posts 21 to form diffused regions 23 in the epitaxial layer 17 which are defined by P-N junctions 24. The P-N junctions extend to the surface 18 beneath the posts 21 so that in plan the P-N junctions at the surface 18 form closed lines in the form of small circles which enclose a plurality of small areas beneath the posts. These P-N junctions extend generally over the surface 18 except for the areas or spaces 22.

After the diffusion step has been completed, the posts 21 are removed in a suitable manner such as by etching so that the surface 18 is completely exposed. The surface 18 is then cleaned. After the surface 18 has been cleaned, a very thin controlled layer 26 of a relatively precise thickness of insulating material is grown on the surface 18 to completely cover the same. Typically, this layer 26 can be a layer of silicon dioxide having a thickness ranging from 1,000 to 1,200 Angstroms.

Thereafter, by the use of conventional photolithographic techniques of the type hereinbefore described, and thereafter by the use of a suitable etch, recesses 27 extending transversely of the semiconductor body are formed in the oxide layer 26 and extend down to the surface 18 where they make contact with the surface 18 in the regions 22 which were not covered by the posts 21 so that the diffused regions 23 are exposed in the recesses 27.

As soon as the recesses 27 have been formed, a thin metal film 28 of a suitable material such as aluminum is deposited on the surface of the oxide layer 26 by suitable means such as evaporation so that the aluminum layer extends into the recesses 27 and makes contact with the diffused regions and also generally overlies the entire surface 26. Conventional photolithographic techniques are again utilized and the exposed portions of the aluminum are etched away so that there remains a metallic lead structure 31 which serves as the source contact.

As can be seen, this lead structure 31 consists of a relatively wide portion which extends longitudinally of the semiconductor body and which is provided with fingers **31*b* which overlie and extend into the recesses 27 to contact the diffused regions 23 which form the source as hereinafter described. There also remains a lead structure 32 which covers a substantial portion of the remaining surface of the surface 18 and is also provided with a portion 32*a* which extends longitudinally of the semiconductor body and portions 32*b* which are interdigitated between the finger portions 31*b* of the lead structure 31. This lead structure 32 overlies the thin oxide 26 which serves as a gate oxide as hereinafter described and which, in turn, overlies the discrete source junctions. The wider stripes or portions 32*b*** generally overlie the circular junctions which form the active gate area of the semiconductor device. This substantially completes the semiconductor device and it is ready for use.

If it is desired to utilize the device with an upside-down bonding system, the additional steps shown in FIGS. 9–12 can be utilized to fabricate a semiconductor device which can be readily bonded upside-down to be incorporated in the structure in which it is to be utilized. To accomplish this, a layer 36 formed of an insulating material is deposited over the lead structures 31 and 32. Typically, this can be a pyrolytic oxide which is deposited at a low temperature as, for example, 400° C. After the layer 46 has been deposited, conventional photolithographic techniques and a suitable etch are utilized to form a plurality of rectangular openings 37 which extend laterally of but which are spaced longitudinally of the semiconductor body. These openings 37 extend down through the layer 36 and expose the metal portions **32*b* which serve as the gate contact. In addition, there is provided an elongate opening 38 which extends longitudinally of the semiconductor body and which extends through the layer 36 to expose the portion 31*a* of the lead structure forming the source contact. A relatively thick metal layer 41 is then deposited over the layer 36 and into the openings 37 and 38. The thick metal layer 41 can be formed of a single metal or, alternatively, can be formed of a plurality of metals to provide a metal system of a conventional type which is particularly suitable for upside-down bonding. Thereafter, by conventional photolithographic techniques and by suitable etch, the undesired merae is removed so that there remains a plurality of raised posts or pedestals 42 which extend laterally of and are spaced longitudinally of the semiconductor body. In addition, there is provided an elongate post or pedestal 43 which extends longitudinally of the body. As can be seen, the posts 42 are provided for making contact to the gate and the post 43** is provided for making contact to the source. It can be readily seen that merely by turning the semiconductor device upside-down that the semiconductor device can be bonded to a substrate carrying a lead pattern which corresponds to the lead pattern carried by the semiconductor device.

When upside-down or flip-chip bonding is utilized, both the source and the drain will be face down on the header and the drain will be upside-down. The back side of the semiconductor body 16 is provided with metallization 44 and a lead contact is made to this back side.

With the above utilization of flip-chip bonding, there is better thermal dissipation which is particularly advantageous at higher power levels. The heat will pass more quickly into the header in which the device is mounted as those regions where most of the heat is generated, namely, the gate and the source are directly over the header. Flip-chip bonding has another advantage in that it reduces the source and gate lead inductance which could possibly limit the high frequency performance of the semiconductor device.

When the device is completed as shown either in FIGS. 8 or 12, it operates as a surface controlled avalanche transistor. From the construction of the semiconductor device as can be seen particularly from FIG. 8, it will be noted that the gate metal 32 and the gate oxide 26 extend over most of the P+ (source) diffused regions except where the source contact metal 31 is. For this reason, there is no necessity to align gate metal around individual source junctions which was the case with the conventional designs heretofore utilized. The gate overlay distance for a particular region of source periphery is determined by the original source diffusion oxide cuts which, in the present invention, are represented by numerous small diameter circles where the junctions extend to the surface 18. By decreasing the size of the circles, it is possible to increase the frequency of operation of the device.

Figure 13:
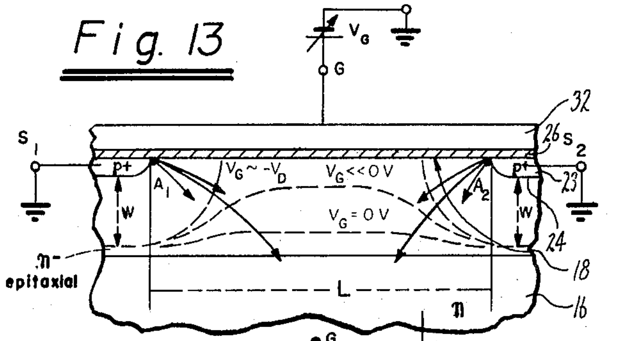
FIG. 13 is a cross-sectional view of a surface controlled avalanche semiconductor device incorporating the present invention and showing its operating characteristics.

The semiconductor device of the present invention still operates as a surface controlled avalanche transistor even though the field lines and the depletion region shapes associated with the adjacent P-N junctions are quite different from those encountered in conventional surface controlled avalanche transistors. That such surface controlled avalanche action takes place can be understood by reference to FIG. 13 which shows two adjacent surface controlled avalanche transistors in parallel and which correspond to two of the adjacent diffused regions 23 and the associated structure. The sources of each, S1 and S2, are interconnected on the semiconductor body and at ground potential. Appropriate voltages are supplied to the gate and rain as indicated. First, consider the situation where L is large, i.e. L>> 2 $W_D$, where $W_D$ is the maximum depletion width at breakdown. In this case, the two surface controlled avalanche transistors will be non-interacting and each will behave normally. Shown in FIG. 13 are three conditions of gate bias corresponding to a fixed drain potential $V_D < V_{D\,max}$, and are indicated as $V_G$=OV, $V_G$ is substantially less than $O_V$ and $V_G$ is approximately $-V_D$. The arrows emanating from the avalanche source points $A_1$, $A_2$ indicate the direction of current flow from both surface controlled avalanche transistors. The magnitude of current increases as $V_G$ becomes more and more positive. This situation is not the optimum one because part of the gate region outside of the depletion region associated with the P-N junctions 24 represent parasitic capacitance.

Figure 14A:
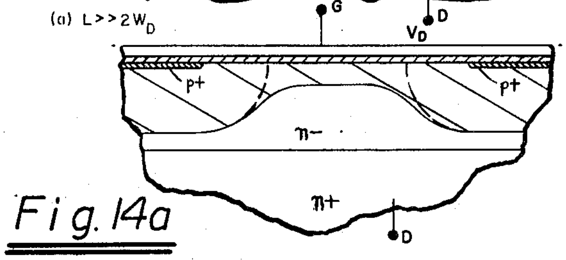
FIGS. 14A, B and C are cross-sectional views which show the effect of decreasing source separation on the depletion region shape for the surface controlled avalanche semiconductor device incorporating the present invention.

FIGS. 14A, B and C illustrate the behavior of the surface controlled avalanche transistors as L becomes increasingly smaller. A particular drain voltage $V_D$ and a particular gate potential $V_G > V_{GO}$ have been chosen. In all three cases, the N- resistivity is the same. In analyzing the effect of decreasing L on the depletion region shape in FIGS. 14A, B and C, a two-dimensional approach is utilized although this is not strictly correct since the space charge spreads radially inward from the source periphery and will obviously lead to field crowding at the surface 18. However, the qualitative features can be understood from FIGS. 14A, B and C.

Figure 14B:
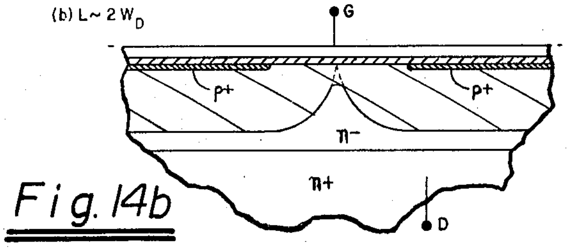
Figure 14C:
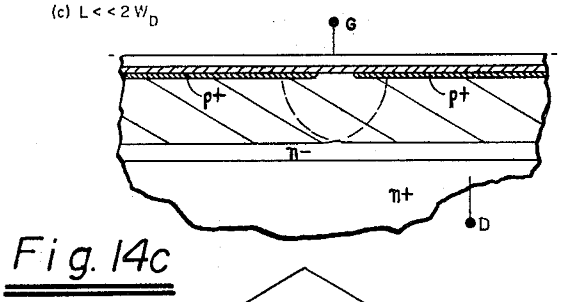

In FIG. 14A we have the situation when L is substantially greater than 2 $W_D$ and both sides of the surface controlled avalanche transistor behave normally. Modulation of the depletion region shape via gate voltage removes critical field limitations from the junction edges. In FIG. 14B corresponding to the case when L is approximately equal to 2 $W_D$, the depletion regions associated with adjacent P-N junctions approach very close to each other for $V_G \approx -V_D$. Space charge shaping via gate potential still can take place resulting in variable breakdown control. When L is substantially less than 2 $W_D$ as shown in FIG. 14C, the situation is changed drastically since P-N junction depletion regions effectively overlap eliminating curvature effects whether gate voltage is applied or not. Thus, plane junction behavior is obtained irrespective of the gate and no control of breakdown is possible. Of course, the N- resistivity dictates $W_D$ and extremely small L (high frequency) can be obtained providing the doping of the epitaxial layer is high enough. Thus, in summary, FIG. 14A shows a low frequency semiconductor device; FIG. 14B shows a high frequency semiconductor device; and FIG. 14C shows a semiconductor device in which surface controlled avalanche action is not possible.

It is believed that the optimum conditions for a surface controlled avalanche transistor design incorporating the present invention operating at the highest frequencies are as follows:

$V_{D\,max} > 30$ volts (field crowding breakdown)
i.e., $\rho_n^* \approx (0.4\text{–}0.7)\ \Omega$ cm
i.e., $W_D \approx (1.5\text{–}3.0)$ microns $\approx t_{epi}$
i.e., $L \approx (3\text{–}6)$ microns.

The above design criteria were established from the following reasons. Lower limit of the surface controlled avalanche transistor drain voltage is approximately 30 volts. Thus, $V_{D\,max}$ should be greater than 30 volts and a range of (40–60) volts is reasonable. The N- resistivity for such breakdowns is shown. Thence, $W_D$ and all dimensions follow.

With such a design, the small signal $f_{max}$ is in the range of (8–16) GHz.

A semiconductor device constructed in the manner shown in FIG. 8 had the following characteristics:

transconductance $g_m$ = 60,000 $\mu$mhos at $I_D$ = 150 mA; $V_D$ = 65 volts.

Total source-drain periphery was 1.25 cm. Total area of device was $1.9 \times 10^{-3}$ cm$^{-2}$.

Figure 15:
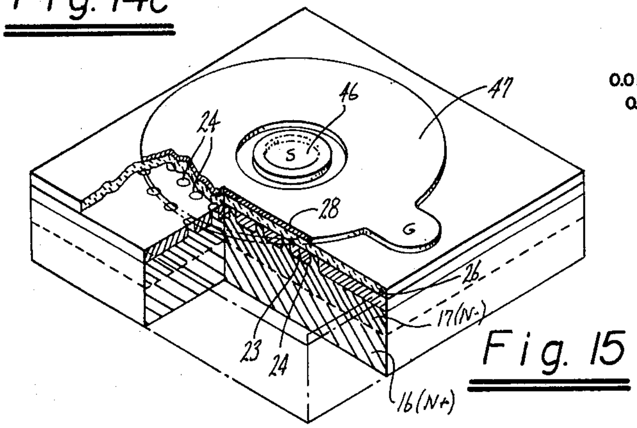
FIG. 15 is an isometric view, partly in cross-section, showing another embodiment of a surface controlled avalanche semiconductor device incorporating the present invention.

A UHF power semiconductor device incorporating the present invention is shown in FIG. 15. Such a semiconductor device is constructed in a manner very similar to that hereinbefore described, the principal difference being in the geometry utilized. Thus, it can be seen in FIG. 15 a circular geometry has been utilized rather than a rectangular geometry. Diffused regions 23 are provided in the epitaxial layer 17 and which are defined by dish-shaped junctions which extend to the surface. As can be seen, the junctions 24 at the surface are circular in shape and are very small and are disposed in a predetermined pattern over a substantial portion of the surface 18 of the epitaxial layer 17. The central area is devoid of such junctions and source metallization 46 extends through the oxide layer 26 and forms a source contact to the diffused regions. Gate metallization 47 is provided which overlies the thin oxide layer 26 and overlies the junctions 24 which have been formed in the semiconductor body. Thus, it can be seen that the source contact is the central circular metal 46 while the gate contact is the outside ring metal 47 which completely covers the individual junction areas. In the pattern of very small circular junction areas it will be noticed that there is an absence of small circles in certain areas of the surface 18. This aids source current flow from the outer regions of the semiconductor body.

By way of example, one semiconductor device constructed in accordance with FIG. 15 had the following relevant dimensions:

$L$ = 25 microns $W_D \approx (4\text{–}8)$ microns $\rho_n \approx (1\text{–}2)\ \Omega$ cm. The construction was not completely optimized because $L$ is grater than 2 $W_D$ but $f_{max}$ was approximately equal to 2 GHz with a high wattage output. The total source periphery in the devices was approximately 1.25 cm.

Figure 16:
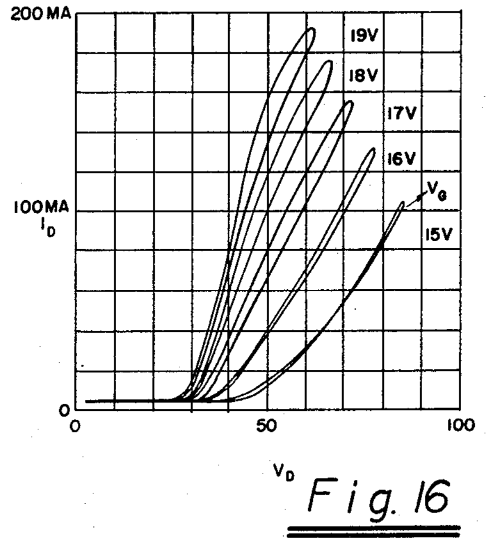
FIG. 16 is a graph showing the d.c. characteristics of a single cell of a surface controlled avalanche semiconductor device incorporating the present invention.

FIG. 16 is a graph showing the d.c. performance of a device constructed in accordance with FIG. 15. I was found that individual devices were able to withstand 30 watts d.c. power provided the devices are mounted on an efficient heat sink. The table below shows the "$s$" parameter characterization of such a device indicating that $f_{max}$ is greater than 1 GHz.

TABLE

| Frequency (GHz) | M.A.P.G. (dB) |
|---|---|
| 0.500 | +9.0 |
| 0.600 | +7.3 |
| 0.800 | +4.3 |
| 1.000 | +2.0 |

Figure 17:
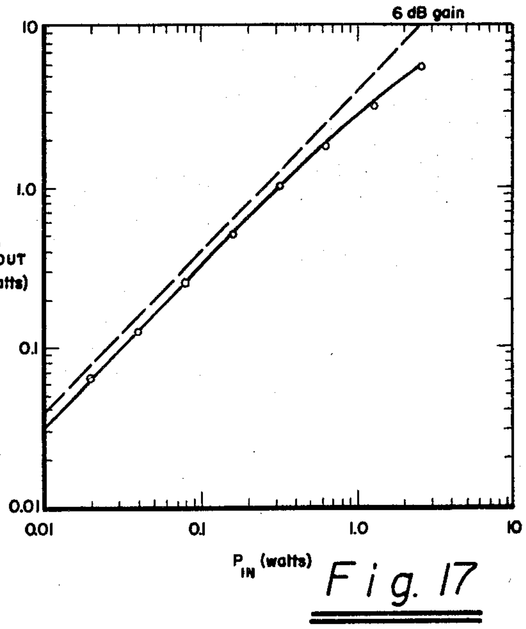
FIG. 17 is a graph showing a plot of power-in versus power-out for the semiconductor device shown in FIG. 15.

FIG. 17 is a graph of power-in versus power-out for a semiconductor device constructed in accordance with FIG. 15. As can be seen from this graph, the rf performance was very good. The graph summarizes the behavior of such a device at increasing input power levels. For example, 5.7 watts rf output at 500 MHz with a 3.5 dB gain was typical which represented 70 percent efficiency.

From the foregoing, it can be seen that an excellent surface controlled avalanche semiconductor device has been provided. Transistors utilizing this construction can be made so that they will provide microwave small signal and UHF power performance which compares very favorably with bipolar transistors. The simplicity of construction and the method of fabrication of the present semiconductor devices makes them more attractive than dipolar transistors especially for high power applications. The present semiconductor devices provide a higher power density per unit area.

The device has a self-aligned gate. In other words, it is unnecessary to align the gate with active regions as is the case with conventional devices. It has much greater d.c. power capability per unit area than conventional devices. The device is particularly suitable for microwave and UHF applications because it has a high input impedance which minimizes lead-in inductance which is particularly important in high frequency devices. Since the avalanche mechanism has a negative temperature coefficient, the device will tend to turn itself off as it heats up rather than on. This is the opposite of rf bipolar transistors which have a tendency to run away if a hot spot occurs in the device. In the device incorporating the present invention, a single noncritical diffusion is required, whereas, on the other hand, bipolar transistors require a plurality of very accurate diffusions.

We claim:

1. In a surface controlled avalanche semiconductor device, a semiconductor body having a planar surface, said body having an impurity therein of one conductivity type, regions of opposite conductivity formed in said body and forming P-N junctions which extend to the surface to form a pattern comprising a plurality of closed lines enclosing a plurality of small areas, at least one portion of the surface of the semiconductor body being free of said junctions, a layer of insulating material overlying said surface, an opening formed in said layer of insulating material and exposing said portion which is free of said junctions and which is in contact with said regions of opposite conductivity type, source metal extending through said opening and making contact with said portion and gate metal separated from said source metal and overlying said layer of insulating material and all portions of all of said P-N junctions and the portions of said body of one conductivity type between said P-N junctions.

2. A device as in claim 1 wherein said source metal is centrally disposed and wherein said gate metal surrounds said source metal.

3. A device as in claim 1 wherein said P-N junctions are spaced so that there are provided a plurality of portions of said surface which are free of said junctions and wherein said source metal makes contact to each of said portions.

4. A device as in claim 3 wherein said portions are spaced on the device and wherein said source metal and said gate metal are interdigitated.

5. A device as in claim 1 together with an additional layer of insulating material overlying said source metal and said gate metal, openings formed in said additional layer of insulating material and extending down to the gate metal, at least one additional opening formed in said additional layer of insulating material and extending down to said source metal, and relatively thick layers of metal deposited on the surface of said additional layer of insulating material and making contact with said source metal and with said gate metal.

6. A device as in claim 1 wherein said closed lines are in the form of small circles which are spaced from each other.

7. A device as in claim 6 wherein said circles are arranged in a predetermined pattern.

8. A device as in claim 6 wherein said circles are arranged in a plurality of groups of rows in which said portions free of junctions are spaced between said groups of rows.

9. A device as in claim 1 wherein said semiconductor body is formed of a layer of single crystal silicon of said one conductivity type and an epitaxial layer of said one conductivity type with said certain regions being formed in said epitaxial layer.

10. A device as in claim 9 wherein said epitaxial layer of the semiconductor body has a greater impurity concentration than the single crystal layer.

* * * * *